(12) United States Patent
Shibata et al.

(10) Patent No.: US 7,435,366 B2
(45) Date of Patent: Oct. 14, 2008

(54) MOLDED PRODUCT AND PROCESS FOR MANUFACTURING THE SAME

(75) Inventors: Minoru Shibata, Aichi-ken (JP); Tatsuo Yamada, Aichi-ken (JP); Katsuhiro Katagiri, Aichi-ken (JP); Shigehiro Ueno, Aichi-ken (JP); Akiyoshi Nagano, Aichi-ken (JP); Kenji Sugiyama, Aichi-ken (JP); Shigeru Yabuya, Aichi-ken (JP); Kazumichi Shigeno, Aichi-ken (JP); Naoshi Furukawa, Nagoya (JP); Ryoichi Katayama, Komaki (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 484 days.

(21) Appl. No.: 10/651,248

(22) Filed: Aug. 29, 2003

(65) Prior Publication Data
US 2006/0010801 A1 Jan. 19, 2006

(30) Foreign Application Priority Data
Aug. 29, 2002 (JP) ............................ 2002-251192
May 16, 2003 (JP) ............................ 2003-139452

(51) Int. Cl.
*B29C 65/00* (2006.01)
(52) U.S. Cl. .................. 264/46.5; 264/259; 264/263
(58) Field of Classification Search ............. 296/70, 296/24.34; 298/27.3; 52/309.1; 264/46.5, 264/259, 261, 263
See application file for complete search history.

(56) References Cited

U.S. PATENT DOCUMENTS

| 4,806,094 A | * | 2/1989 | Rhodes et al. | 425/543 |
| 5,358,300 A | * | 10/1994 | Gray | 296/192 |
| 7,040,686 B2 | * | 5/2006 | Kapteyn | 296/70 |

FOREIGN PATENT DOCUMENTS

| JP | A-03-236945 | 10/1991 |
| JP | A-2000-351351 | 12/2000 |
| JP | A-2001-233087 | 8/2001 |
| JP | A-2001-249033 | 9/2001 |
| JP | A-2002-067052 | 3/2002 |
| JP | A-2002-264644 | 9/2002 |
| JP | A-2002-316534 | 10/2002 |
| JP | A-2003-112326 | 4/2003 |

OTHER PUBLICATIONS

Office Action dated Mar. 28, 2008 in corresponding Japanese Patent Application No. 2003-139452.

* cited by examiner

*Primary Examiner*—Katherine Mitchell
*Assistant Examiner*—Candace L. Bradford
(74) *Attorney, Agent, or Firm*—Posz Law Group, PLC

(57) ABSTRACT

In a molded product, at least an opening end, forming a window frame of a window formed as a part of a molded subassembly, is fastened integrally to a skin of the molded subassembly. Alternatively, a decorative component part is disposed on an outer periphery of the window so that a parting line between the decorative component part and the skin is visible as being joined closely in a decorative surface of the completed molded product. Processes for manufacturing the same are disclosed as well.

8 Claims, 13 Drawing Sheets

MOLDED PRODUCT AND PROCESS FOR MANUFACTURING THE SAME

FIELD OF THE INVENTION

The present invention relates to a molded product having an integral skin and provided integrally with a functional component part (hereinafter abbreviated to as "molded product"). More particularly, it relates to a technology for integrating a functional component part and a molded subassembly which are disposed in a manner neighboring with each other.

DESCRIPTION OF THE RELATED ART

Molded products have been known conventionally. Molded products have a three-layer construction which comprises a relatively hard substrate, a relatively soft skin, and a foamed layer disposed between the substrate and the skin. The foamed layer is made of foamed resin. The substrate gives rigidity to the molded products. The skin gives a diversity of colors and a variety of superficial shapes to them. The foamed layer gives three-dimensional feelings to them. Thus, the molded products show decorativeness. The molded products have been used conventionally as component parts which make a decorative surface of various products. Hence, the molded products function to give fine decorativeness to the appearance of products.

Meanwhile, in products whose decorative surface is made of the molded subassemblies, it is often required to expose a functional component part in the decorative surface in order that the function effected inside the products can be conveyed to the outside of the products. For example, instrument panels comprising molded subassemblies are disposed in automotive passenger rooms. The instrument panels make a decorative surface in automotive passenger rooms, and are provided with a variety of functional component parts such as air-conditioner registers, defrosters and speaker grills. In products like the instrument panels, it has been done generally that a window is formed in the molded subassemblies in order to expose the functional component parts. Thus, the functional component parts are exposed in the decorative surface of completed products through the window.

Functional component parts have been usually exposed in the decorative surface of completed product through a window of molded subassemblies in the following manner. A window is pierced through a molded subassembly formed in advance. Then, a functional component part is fitted into the window, and is fastened to the molded subassembly by covering the frame of the window with a covering component part such a bezel. When the covering component part covers the frame of the window to fix the functional component part to the molded subassembly, it is possible not only to inhibit the foamed layer of the molded subassembly from being visible in the decorative surface, but also to assemble the functional component part with the molded subassembly while the covering component part is interposed between the functional component part and the molded subassembly. FIG. 13 illustrates a conventional molded product in which a molded subassembly, a functional component part and a covering component part are used.

In the drawing, the functional component part is a register 200. The register 200 is provided with vertical fins 201 and horizontal fins 202 for determining wind directions, and is assembled with a molded subassembly 204 by a bezel 203 (i.e., the covering component part).

As described above, the skin layer 205 of the molded subassembly 204 is relatively soft, and the foamed layer 206 exhibits elasticity. Accordingly, the bezel 203 pressurizes the molded subassembly 204 so as to compress it in the thickness-wise direction. Consequently, a step 208 might occur between the molded subassembly 204 and the bezel 203 to degrade the decorative surface 207 in terms of the decorativeness. Moreover, when the step 208 occurs, a gap 211 arises between an apparent window 210, a part of the window 209 which is formed in the molded subassembly 204 and which is exposed in the decorative surface 207, and the bezel 203. As a result, the gap 211 impairs the integrity of the bezel 203 and the molded subassembly 204. Thus, the decorativeness of the decorative surface 207 might be further degraded. Moreover, the entire weight of the completed product might be enlarged more than necessary, because the bezel 203 molded independently is assembled with the molded subassembly 204. In addition, the completed product might have a problem with the increased manufacturing cost, because the manufacturing process in which the bezel 203 molded independently is assembled with the molded subassembly 204 requires a great deal of manufacturing man-hour requirements.

Hence, as disclosed in Japanese Unexamined Patent Publication (KOKAI) No. 2001-233,087, for example, a molded product has been developed whose skin and substrate form the frame of the window, and whose functional component part is assembled with the substrate.

In the molded product disclosed in the patent publication, a part of the molded subassembly covers the frame of the window. Moreover, the frame of the widow is formed by overlapping the end of the skin on the end of the substrate. The foamed layer covers the overlapped ends. Accordingly, no covering component part is required independently to cover the frame of the window. Consequently, no step and gap resulting from covering component parts occur. Thus, the molded product is good in terms of the decorativeness.

However, in the molded product disclosed in the patent publication, a foaming process is carried out in order to form the foamed layer while the ends of the skin and substrate which make the frame of the window are simply butted. Accordingly, gaps might occur between the skin and the substrate when the skin contracts, or the foamed resin might leak between them, because the opening end of the skin is not bonded to the opening end of the substrate. Moreover, the appearance of the molded product might be degraded, because the functional component part is disposed in and fixed to the window so that gaps occur between the frame of the window and the functional component part. In addition, the molded product has a problem with a great deal of manufacturing man-hour requirements still, because a cutting step is needed in which the skin is cut to form the window.

In the molded product disclosed in the patent publication, the functional component part is assembled with the substrate. Accordingly, only the color and superficial shape of the skin and the three dimensional feelings of the foamed layer express the decorativeness in the decorative surface. However, molded products have been required recently, molded products which can offer a wider variety of decorativeness.

SUMMARY OF THE INVENTION

The present invention has been developed in view of the aforementioned circumstances. It is therefore an object of the present invention to provide a molded product which makes it possible to form a decorative surface offering fine decorativeness with a lesser number of manufacturing steps, and a process for manufacturing the same.

A first aspect of the present invention is a molded product, comprising:
a molded subassembly including:
a substrate;
a foamed layer formed on the substrate; and
a skin covering the foamed layer; and
a window formed as a part of the molded subassembly, and demarcated by a window frame; and
a functional component part including:
an opening end forming the window frame of the window, and fastened integrally to the skin at a part thereof at least; and
a functional unit disposed in the opening end.

In the present molded product, the opening end of the functional component part can preferably have an end surface, at least the end surface fastened integrally to the skin and covered with a part of the molded subassembly; and the skin can preferably cover the end surface to appear as a part of a decorative surface of the molded product. Moreover, the opening end can preferably be held to the substrate.

A second aspect of the present invention is a molded product, comprising:
a molded subassembly including:
a substrate;
a foamed layer formed on the substrate; and
a skin covering the foamed layer; and
a window formed as a part of the molded subassembly, and demarcated by a window frame; and
an opening-end component part forming the window frame of the window;
a functional unit disposed in the opening-end component part; and
a decorative component part disposed on an outer periphery of the window, wherein:
a parting line between the decorative component part and the skin is visible as being joined closely in a decorative surface of the molded product.

In the present molded product, at least a part of the opening-end component part can preferably be fastened to the skin integrally. Moreover, the opening-end component part can preferably be held to the substrate.

A third aspect of the present invention is a process for manufacturing a molded product, the process comprising the steps of:
forming a skin layer by preparing a functional component part and a mold, the functional component part including an opening end and a functional unit disposed in the opening end, the mold including opposite molding surfaces, one of the opposite molding surfaces having a window-forming surface, disposing the functional component part so that at least the opening end faces one of the opposite molding surfaces, and forming a skin layer on one of the opposite molding surfaces, excepting the window-forming surface, as well as on at least a part of the opening end, wherein the skin layer and at least a part of the opening end are fastened integrally;
forming a foamed layer by disposing a substrate formed in advance on the other one of the opposite molding surfaces of the mold, injecting a raw material between the skin layer and the substrate, and foaming the raw material.

In the present process, the skin layer can preferably be formed on one of the opposite molding surfaces, excepting the window-forming surface, as well as on at least an end surface of the opening end in the skin layer forming step. Moreover, the opening end of the functional unit can preferably be fixed to the substrate in a liquid proof manner in the foamed layer forming step. In addition, the skin layer forming step can preferably be carried out by spray forming.

A fourth aspect of the present invention is a process for manufacturing a molded product, the process comprising the steps of:
forming a skin assembly including a decorative component part and a skin layer by preparing the decorative component part and a mold, the decorative component part including an exposed portion and legs extending from the opposite ends of the exposed portion and having a substantially letter "U"-shaped cross-section, the mold including opposite molding surfaces, one of the opposite molding surfaces having a window-forming surface, disposing the decorative component part so as to face one of the opposite molding surfaces, forming the skin layer on one of the opposite molding surfaces, excepting the window-forming surface, as well as on at least a part of the legs; and
forming a foamed layer by disposing a substrate formed in advance, the skin assembly and an opening-end component part on the other one of the opposite molding surfaces of the mold, injecting a raw material between the substrate, the skin assembly and the opening-end component part, and foaming the raw material, wherein the decorative component part and the skin layer are pressed to close to each other at a parting line therebetween by a foaming pressure exerted by the foaming raw material.

In the present process, a positioning plate having a narrow-width protruding shape in cross-section can preferably be further disposed on one of the opposite molding surfaces of the mold; the parting line between the decorative component part and the skin layer is formed as a narrow-width groove shape conforming to the cross-sectional shape of the positioning plate in the skin assembly forming step; and an opening width of the parting line is reduced by the foaming pressure in the foamed layer forming step. Moreover, the opening-end component part can preferably be fixed to the substrate in a liquid proof manner in the foamed layer forming step. In addition, the skin assembly forming step can preferably be carried out by spray forming.

In the molded product according to the first aspect of the present invention, the opening end is fastened integrally to the skin at least at a part thereof. Accordingly, it is possible to inhibit the foamed layer from being exposed in the decorative surface or to inhibit the foamed layer from being visible. Moreover, no covering component part such as a bezel is required independently to cover the frame of the window. Consequently, no step or gap resulting from the covering component part occurs between the molded subassembly and the opening end. In addition, when the end surface of the opening end is fastened integrally to the skin, the end surface is covered with a part of the molded subassembly, and is covered with the skin as well. Accordingly, the molded subassembly and the opening end have decorative continuity, or the decorative surface is free from the step or gap occurring between the molded subassembly and the opening end. Further, no step or gap occurs between the opening end and the skin. Consequently, no foamed resin leaks between the opening end and the skin. Furthermore, the opening end is held directly or indirectly by the substrate of the molded subassembly. Moreover, no covering component part is needed which is molded independently in advance. As a result, it is possible to reduce the weight of molded products.

In the molded product according to the second aspect of the present invention, the decorative component part gives decorations which were different from those given by the molded subassembly. Accordingly, it is possible to further improve molded products in terms of the decorativeness. Moreover, the parting line between the decorative component part the skin is visible as being joined closely or substantially seamless in the decorative surface. Consequently, the decorative component part and the skin are made more continuous in view of the decorativeness.

In the manufacturing process according to the third aspect of the present invention, it is possible to integrate the skin with the opening end of the functional component part in a single step. Accordingly, it is possible to manufacture molded products which offer good integrity, with ease.

In the manufacturing process according to the fourth aspect of the present invention, the decorative component part and the skin layer are pressed to close with each other at the parting line between them by a foaming pressure exerted by the foaming raw material. Accordingly, it is possible to form a parting line, which is visible as being joined closely or substantially seamless in the decorative surface, with ease. Note that it is possible form such a parting line by the positioning plate which is disposed on one of the opposite molding surfaces of the mold. In this instance, it is possible to position the decorative component part on one of the opposite molding surfaces by the positioning plate easily and reliably. Moreover, when the length and shape of the positioning plate are designed appropriately, it is possible as well to mask the window-forming surface in one of the opposite molding surfaces of the mold, for example.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Figure 1:
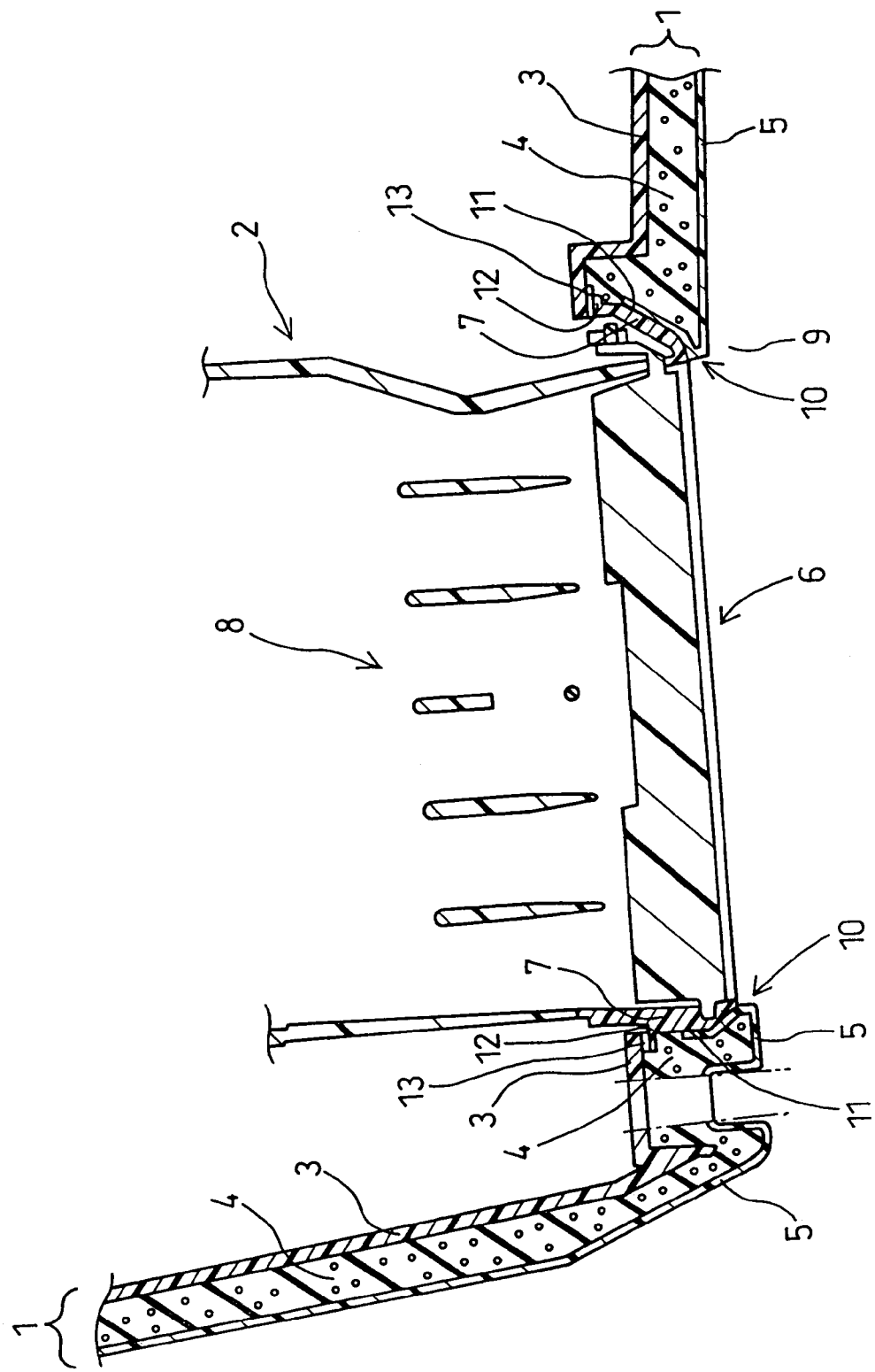
FIG. 1 is a schematic cross-sectional view for illustrating a molded product according to Example No. 1 of the present invention.

Having generally described the present invention, a further understanding can be obtained by reference to the specific preferred embodiments which are provided herein for the purpose of illustration only and not intended to limit the scope of the appended claims.

In the first aspect of the present invention, the present molded product comprises a molded subassembly, and a functional component part.

The molded subassembly includes a substrate, a foamed layer, a skin, and a window. The foamed layer is formed on the substrate. The skin covers the foamed layer. The window is formed as part of the molded subassembly, and is demarcated by a window frame.

The substrate serves to secure the molded subassembly rigidity, and accordingly is hard relatively. The substrate can be formed by usual forming methods with ordinary materials, such as by injection molding with resins and pressing with metals. The rigidity of the substrate is determined by the type of materials and the thickness of formed substrates. However, in view of making the molded subassembly lightweight and reducing the material cost, the substrate can preferably be formed of resinous materials which exhibit high rigidity when they are formed even in thin thickness. The resinous materials can be acrylonitrile butadiene styrene (ABS) resin, acrylonitrile styrene glass (ASG) resin, and reinforced polypropylene.

The foamed layer can be formed by usual foaming methods with ordinary raw materials for foamed resin, and is composed of foamed resins. The foamed resins can preferably be foamed polyurethane, and foamed polyolefine. It has been known that foamed polyurethane is prepared by reacting raw materials, diisocyanate and polyol, and that foamed polyolefine is prepared by heating a polyolefinic raw material containing a foaming agent, pentane, to vaporize the foaming agent.

The skin is exposed in the decorative surface of various products. Accordingly, the skin can preferably be formed of materials which exhibit characteristics such as light resistance, heat resistance and aging resistance. The materials exhibiting the characteristics can be elastomeric resins such as polyurethane. When the skin is formed of elastomeric resins, it is possible to form soft skins with ease while giving the aforementioned characteristics to the resulting soft skins. The skin can be colored in a diversity of colors depending on desired decorations. Moreover, the skin can be molded so as to have a variety of superficial shapes such as embossments.

The window can be formed in sizes conforming to the sizes of the functional component part. The window is formed in the molded subassembly by the later-described skin layer forming step, skin assembly forming step or the foamed layer forming step of the present manufacturing process.

The functional component part includes an opening end, and functional unit. The opening end forms the window frame of the window in the molded subassembly. The functional unit is disposed in the opening end.

As for the functional component part, it is possible to use a variety of known component parts disposed in the decorative surface of versatile products along with the molded subassembly. For example, when the molded subassembly is adapted for an automotive instrumental panel, it is possible to use the above-described registers, defrosters, switches and meter clusters as the functional component part.

The opening end is disposed closest to the decorative surface in all of the constituent parts of the functional component part, and demarcates an outer periphery of the functional component part in the decorative surface. The entire periphery of the opening ends forms the window frame of the window in the molded subassembly. The opening end can be formed of a diversity of materials, such as resins and metals, depending on the types and decorations of the functional component part. In the first aspect of the present invention, note that the end surface of the opening end is one of the constituent surfaces which is disposed behind the decorative surface and closest thereto, or which is exposed in the decorative surface.

The functional unit is a part of the functional component part excluding the opening end, and is disposed in the opening end. The functional unit can be formed independently of the opening end, and thereafter can be assembled with the opening end to integrate with it. Alternatively, the functional unit can be formed integrally with the opening end.

In the first aspect of the present invention, the opening end is fastened integrally to the skin at a part thereof at least. When at least a part of the opening end is fastened integrally to the skin, it is possible to inhibit the foamed layer from exposing over the window frame in the decorative surface, and to make the foamed layer invisible in the decorative surface. In order to more reliably inhibit the foamed layer from exposing and to make it invisible, it is desirable to fasten the opening end to the skin over the entire periphery. Moreover, it is not necessary to additionally dispose a covering component part such a bezel, because the window frame of the window is covered with the opening end and the skin. Accordingly, no steps or gaps resulting from covering component parts occur between the molded subassembly and the opening end.

In the first aspect of the present invention, the opening end can have an end surface, and at least the end surface can be fastened integrally to the skin and covered with a part of the molded subassembly. In this instance, when the decorative surface of the present molded product is viewed, the opening end is visible as it were a part of the molded subassembly because the end surface of the opening end is covered with a part of the molded subassembly. Moreover, among the constituent parts of the molded subassembly, the skin is exposed in the decorative surface. Accordingly, the skin covers the end surface of the opening end to appear as a part of the decorative surface of the present molded product. Consequently, the molded subassembly and the opening end have continuity in view of decorativeness Thus, the present molded product shows good decorativeness. In addition, the end surface of the opening end is fastened integrally to the skin. As a result, no steps or gaps occur between the molded subassembly and the opening end. Note that it is possible to further give a variety of decorations to molded products when a decorative component part is further disposed in the same manner as the second aspect of the present invention hereinafter described.

In the second aspect of the present invention, the molded product comprises a molded subassembly, an opening-end component part, a functional unit, and a decorative component part. The molded subassembly and the functional unit can be identical with those described in the first aspect of the present invention. Moreover, an opening-end component part forms a window frame of a window. In addition, a decorative component part is disposed on an outer periphery of the window.

The opening-end component part can be component parts comprising the same opening end as described in the first aspect of the invention, or can be a part of the substrate of the molded subassembly. Moreover, the opening-end component part can be at least a part of the decorative component part. In all of the instances, the opening-end component part forms the window frame of the window, and the functional unit is disposed in the opening-end component part.

The decorative component part is formed independently of the skin. The decorative component part has at least one designs selected from the group consisting of colors and superficial shapes which are different from those of the skin. Accordingly, the decorative component part gives the present molded product decorations which are different from those of the skin. It is possible to form the decorative component part with a variety of materials such as resins and metals, and to display versatile decorations on the surface of the decorative component part by subjecting it to a diversity of processes such as printing, deposition and coating. Moreover, it is preferable to make the decorative component part from materials which exhibit characteristics such as light resistance, heat resistance and aging resistance, because the decorative component part is exposed in the decorative surface of various products in the same manner as the skin is exposed therein.

In the second aspect of the present invention, a parting line between the decorative component part and the skin is visible as being joined closely in a decorative surface of the present molded product, or substantially seamless therein. As a result, the decorative surface of the present molded product can have not only a variety of decorations but also decorative continuity.

Note that the decorative component part can be disposed on all around the periphery of the window or on a part of the periphery of the window. Moreover, it is possible to adapt at least a part of the decorative component part for the opening-end component part as described above. When at least a part of the decorative component part is adapted for the opening-end component part, it is possible to integrally fasten the decorative component part to an end surface of the opening-end component part in the following manner: an opening end is further disposed on the rear surface of the opening-end component part; and an end surface of the opening end is fastened to the opening-end component part by bonding with an adhesive, for example. In addition, it is possible to further dispose the decorative component part on parts of the window other than the window periphery.

In the first and second aspects of the present invention, the opening end or the opening-end component part can be held to the substrate of the molded subassembly.

In the first and second aspects of the present invention, the skin and foamed layer of the molded subassembly are relatively soft, and exhibit relatively low rigidity. On the other hand, the substrate is relatively hard, and exhibits relatively high rigidity. Accordingly, when the opening end or the opening-end component part is held by the substrate of relatively high rigidity, it is possible to securely integrate the molded subassembly with the functional component part. Note that the opening end is integrated with the skin at least at a part thereof according to the first aspect of the present invention. Consequently, the opening end is held to the skin at least. However, when the opening end has a heavy weight or the functional unit held to the opening end has a heavy weight, it might be difficult to integrate the opening end with the skin over a long period of time. Therefore, when the opening end is further held to the substrate, it is possible to integrate the opening end with the molded subassembly more reliably. The opening end or the opening-end component part can be held to the substrate by a diversity of methods, for example, bonding with an adhesive, engaging and fitting.

The functional unit is disposed in the opening end or the opening-end component part. When the functional unit is integrated with a certain functional device which is disposed in the window of the molded subassembly in advance, the functional unit might not be held to the opening end or the opening-end component part and further to the substrate. However, when the functional unit is integrated with the opening end or the opening-end component part and is held to the opening end or the opening-end component part, the functional unit is held to the substrate indirectly.

Moreover, it is possible to integrally fasten at least a part of the opening-end component part to the skin. In this instance, it is possible to more reliably inhibit the foamed layer from exposing in the decorative surface of the window frame or from being visible in the decorative surface.

The manufacturing process according to the third aspect of the present invention is adapted for manufacturing the present molded product according to the first aspect of the present invention. The present manufacturing process comprises a skin layer forming step, and a foamed layer forming step.

In the skin layer forming step, the functional component part is disposed so that at least the opening end faces one of the opposite molding surfaces, and a skin layer is formed on one of the opposite molding surfaces, excepting the window-forming surface, as well as on at least a part of the opening end.

In the skin layer forming step, when the opening end and the functional unit are formed detachably and are then integrated in the used functional component part, it is possible to dispose only the opening end so as to face one of the opposite molding surfaces of the mold. Moreover, when the opening end and the functional unit are formed integrally, it is possible to dispose the opening-end side of the functional component part so as to face one of the opposite molding surfaces of the mold. In both of the cases, the end-surface side of the opening end is disposed so as to face one of the opposite molding surfaces of the mold. As for the mold, it is possible to employ ordinary molds. After the opening end is disposed on one of the opposite molding surfaces, a skin layer is formed on one of the opposite molding surfaces, excepting the portion facing the functional unit. In this instance, it is preferable to form the skin layer after covering portions of the functional component part, such as the inner surface of the opening end, with a mask. Even if the portions of the functional component part are not covered with a mask, it is possible to form the skin layer only on desired portions of the functional component part by appropriately adjusting the cavity configuration of molds or selecting suitable skin forming methods.

In the skin layer forming step, the skin layer is formed on at least a part of the opening end. Accordingly, the skin layer and the opening end are fastened integrally at least at a part of the opening end. The fastening secures the bond between the opening end and the skin layer. Therefore, no gaps occur between the skin layer and the end surface of the opening end. Consequently, it is possible to inhibit foaming resinous material from leaking between the skin layer and the end surface of the opening end in the later-described foamed layer forming step. Thus, the resulting molded products can keep the decorativeness satisfactorily. Moreover, a part of the opening end on which the skin layer is formed can preferably include an end surface of the opening end. If such is the case, it is possible to further inhibit foaming resinous materials from leaking between the skin layer and the end surface of the opening end in the later-described foamed layer forming step. Thus, the resulting molded products can keep the decorativeness more satisfactorily. In addition, the skin layer can desirably be formed on both the end surface of the opening end and a part of an outer peripheral surface of the opening end. When the skin layer is formed on a part of an outer peripheral surface of the opening end, it is possible to more reliably inhibit foaming resinous materials from leaking. Thus, the resulting molded products can keep the decorativeness much more satisfactorily. Note that a part of the skin layer to be disposed on the periphery of the window is integrated with the opening end while it is fastened to the opening end in the skin layer forming step. Consequently, it is possible to integrate the skin and the opening end in a single step. As a result, it is possible to reduce the man-hour requirements for manufacturing. Thus, it is possible to manufacture products offering good decorativeness with ease.

In the skin layer forming step, the skin layer is formed at least a part of the decorative surface of the opening end of the functional component part, and eventually appears as a part of a decorative surface of completed molded products.

The skin layer forming step can be carried out by usual forming methods with resin, such as spray forming and powder slush forming. For example, when the opening end is formed of highly heat-resistant material, such as metals, it is possible to form the skin layer by powder slush forming with a powdery raw material for the skin layer in the following manner. The powdery raw material is deposited on one of the opposite molding surfaces of the heated mold or on the heated opening end, and is heated thereon. Accordingly, the powdery raw material melts to form the skin layer. Moreover, when the opening end is formed of less heat-resistant material, such as resins, it is possible to form the skin layer on one of the opposite molding surfaces of the mold or on the opening end by spray forming with a liquid raw material for the skin layer. In the skin layer forming step, it is further preferable to employ spray forming, because it is possible to easily form the skin layer having a thin thickness by spray forming regardless of the material quality and shape of the opening end.

The foamed layer forming step can be carried out by known methods with ordinary foaming molds. For example, the foaming mold comprises an upper mold half, a lower mold half, and a cavity formed in the upper and lower mold halves. The cavity can be formed as a variety of known shapes. Note that a part of the mold used in the skin layer forming step is generally used as a part of the foaming mold.

In the foamed layer forming step, a substrate formed in advance is disposed on the other one of the opposite molding surfaces of the mold so as to face one of the opposite molding surfaces on which the skin layer is formed in the skin layer forming step, and a raw material for the foamed layer is injected and foamed between the skin layer and the substrate. Thus, a molded product comprising the substrate, the foamed layer and the skin layer is completed.

Note that at least a part of the opening end of a functional component part is formed integrally with the molded subassembly in the foamed layer forming step. Accordingly, it is needed as well to inhibit foaming resinous materials from leaking between the substrate and functional component parts. Therefore, it is preferable to fix the substrate to the opening end in a liquid proof manner. The substrate can be fixed to the opening end in a liquid proof manner in the same fashion as the opening end is held to the substrate in the above-described present molded product, for example, by bonding with an adhesive, engaging and fitting.

Note that nothing is formed inside the opening end of the functional component part in molded products completed by the skin layer forming step and foamed layer forming step. Accordingly, the inside of the opening end makes the window. Moreover, the window contacts with the entire periphery of the opening end. Consequently, the opening end forms the widow frame of the window.

The manufacturing process according to the fourth aspect of the present invention is adapted for manufacturing the present molded product according to the second aspect of the present invention. The present manufacturing process comprises a skin assembly forming step, and a foamed layer forming step.

In the skin assembly forming step, a skin assembly including a decorative component part and a skin layer is formed in the following manner. The decorative component part is formed in advance, decorative component which has a substantially letter "U"-shaped cross-section and includes an exposed portion and legs. A mold is prepared in advance, mold which includes opposite molding surfaces. Note that one of the opposite molding surfaces has a window-forming surface. First, the decorative component part is disposed so as to face one of the opposite molding surfaces of the mold. Then, a skin layer is formed on one of the opposite molding surfaces, excepting the window-forming surface, as well as on at least a part of the legs. Note that the window-forming surface of the mold is a part of one of the opposite molding surfaces and is adapted for molding the inside of the window in the molded subassembly. In other words, the window-forming surface designates one of the opposite molding surfaces on which no skin layer and foamed layer are formed.

The decorative component part used herein gives completed molded products decorations which are different from those of the skin layer or the skin assembly in the decorative surface. The exposed portion of the decorative component part appears in the decorative surface of completed molded products, and the legs extend from the decorative surface into the inside of the completed molded products. When a skin layer is formed on one of the opposite molding surfaces of the mold, excepting the window-forming surface, as well as on at least a part of the legs, the skin layer is integrated with the decorative component part so that the skin layer or the skin assembly is formed. Note that, in the skin assembly, the seam between the legs of the decorative component part and the skin layer formed on the legs makes the parting line described later. As set forth above, the legs extend from the decorative surface into the inside of completed molded products. Accordingly, the parting line is also formed so that it extends from the decorative surface into the inside of completed molded products.

In the skin assembly forming step, it is possible to form the skin layer by usual forming methods with resin, such as spray forming and powder slush forming, as set forth above. Among usual forming methods with resin, spray forming is a preferable option for carrying out the skin assembly forming step.

In the foamed layer forming step of the manufacturing process according to the fourth aspect of the present invention, a substrate formed in advance, the skin assembly and an opening-end component part are disposed on the other one of the opposite molding surfaces of the mold, and a foamed layer is formed between the substrate, the skin assembly and the opening-end component part. Then, the decorative component part and the skin layer are pressed to close to each other at a parting line therebetween by a foaming pressure exerted by the foaming raw material. Accordingly, the parting line is visible as being joined closely in the decorative surface or substantially seamless therein. Thus, it is possible to form the parting line viewable as being joined closely or substantially seamless in the decorative surface with ease by the foamed layer forming step.

In the skin layer forming step of the manufacturing process according to the fourth aspect of the present invention, a positioning plate having a narrow-width protruding shape in cross-section can preferably be further disposed on one of the opposite molding surfaces of the mold; the parting line between the decorative component part and the skin layer can preferably be formed as a narrow-width groove shape conforming to the cross-sectional shape of the positioning plate in the skin assembly forming step. The thus disposed positioning plate makes it possible to easily and securely position the decorative component part on one of the opposite molding surfaces of the mold. Moreover, when the length or shape of the positioning plate is designed appropriately, it is possible to mask the window-forming surface in one of the opposite molding surfaces, for example, with the positioning plate. The positioning plate can extend from the one of the opposite molding surfaces, on which the skin layer is formed, to the other one of the opposite molding surfaces. The shapes of the positioning plate can be designed appropriately depending on the desired groove shapes of the parting line. However, the narrower width the groove shape of the parting line has, the more reliably the parting line is visible as being joined closely or substantially seamless in the decorative surface. Accordingly, the positioning plate can preferably have a thickness as thin as possible. For instance, the positioning plate can desirably have a thickness of from 0.1 to 0.5 cm. When the parting line is formed as a narrow-width groove shape, the narrow-width grooved parting line is pressurized inward by a foaming pressure exerted by the foaming raw material. Consequently, the opening width of the parting line is reduced by a foaming pressure exerted by the foaming raw material. As a result, the parting line is visible as being joined closely or substantially seamless in the decorative surface of the thus manufactured molded products.

EXAMPLES

The present invention will be hereinafter described in more detail with reference to specific preferred embodiments illustrated in the accompanying drawings. In Example Nos. 1 through 5, molded products according to the present invention will be described. In Example Nos. 6 and 7, processes according to the present invention for manufacturing the molded products will be described.

Example No. 1

In a molded product provided integrally with a function component part according to Example No. 1 of the present invention, an automotive instrument panel makes a molded subassembly, and a register makes a functional component part. FIG. 1 is a schematic cross-sectional view for illustrating the present molded product according to Example No. 1. Note that Example No. 1 relates to the first aspect of the present invention.

As illustrated in FIG. 1, the present molded product according to Example No. 1 comprises a molded subassembly 1, and a functional component part 2. The molded subassembly 1 includes a substrate 3, a foamed layer 4 formed on the substrate 3, and a skin 5 covering the foamed layer 4. Moreover, a window 6 (i.e., a through hole) is formed in the molded subassembly 1.

The functional component part 2 includes an opening end 7, and a functional unit 8. The opening end 7 forms the frame of the window 6. The functional unit 8 is disposed in the opening end 7. A part of the opening end 7 is integrated with the skin 5 over the entire periphery, and the rest of the opening end 7 is further integrated with the foamed layer 4 over the entire periphery. In particular, a part of an end surface 10 of the opening end 7 is integrated with the skin 5 over the entire periphery; a part of a side surface 11 of the opening end 7 is integrated with the skin 5 over the entire periphery; and the rest of the end surface 10 and side surface 11 are integrated with the foamed layer 4 over the entire periphery. Note that the end surface 10 is disposed behind and adjacent to a decorative surface 9 of the present molded product according to Example No. 1. Moreover, the opening end 7 includes a holder end 12 to be fixed to the substrate 3. A bonding tab 13 is disposed between the holder end 12 and the substrate 3, one of the opposite ends of the bonding tab 13 is bonded to the holder end 12, and the other one of the opposite ends thereof is bonded to the substrate 3. Accordingly, the opening end 7 is held to the substrate 3 in a liquid proof manner by the bonding tab 3.

The end surface 10 of the opening end 7 is covered not only with the foamed layer 4 but also with the skin 5. Accordingly, when the decorative surface 9 is observed, the opening end 7 is visible as being covered with the skin 5. Consequently, the molded subassembly 1 and the opening end 7 are visible as integral. As a result, in the present molded product according to Example No. 1, a part of the molded subassembly 1 is visible as offering the functions of conventionally used bezels in the decorative surface 9.

Example No. 2

Figure 2:
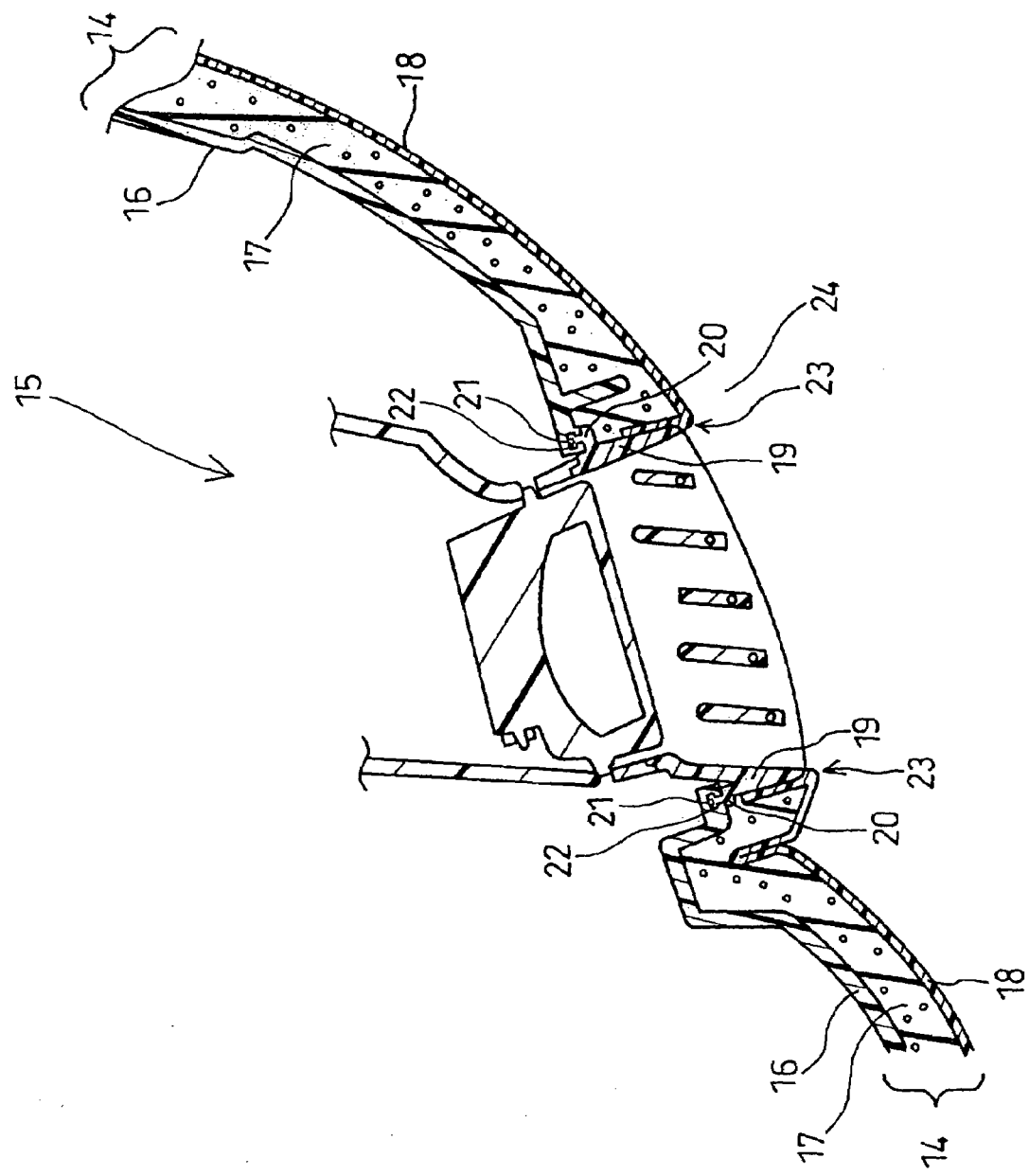
FIG. 2 is a schematic cross-sectional view for illustrating a molded product according to Example No. 2 of the present invention.

In a molded product according to Example No. 2 of the present invention, an automotive instrument panel makes a molded subassembly, and a side register makes a functional component part. Note that Example No. 2 relates to the first aspect of the present invention. Except that the functional component part is different from that of Example No. 1 and the opening end is held to the substrate 3 by engagement, the present molded product according to Example No. 2 has the same arrangements as those of Example No. 1. FIG. 2 is a schematic cross-sectional view for illustrating the present molded product according to Example No. 2.

Similarly to Example No. 1, the present molded product according to Example No. 2 comprises a molded subassembly 14, and a functional component part 15. The molded subassembly 14 includes a substrate 16, a foamed layer 17, and a skin 18. The substrate 16 is provided with engagement holes 21 which face a holder end 20 of an opening end 19 in the functional component part 15. On the other hand, the holder end 20 of the opening end 19 is provided with engagement claws 22 which engage with the engagement holes 21 formed in the substrate 16. Thus, the opening end 19 is held to the substrate 16 by engaging the engagement claws 22 with the engagement holes 21. Similarly to Example No. 1, in the present molded product according to Example No. 2 as well, not only the foamed layer 17 covers an end surface 23 of the opening end 19, but also the skin 18 covers the end surface 23. Hence, when an decorative surface 24 of the present molded product according to Example No. 2 is observed, the molded subassembly 14 and the opening end 19 are visible as integral.

Example No. 3

Figure 3:
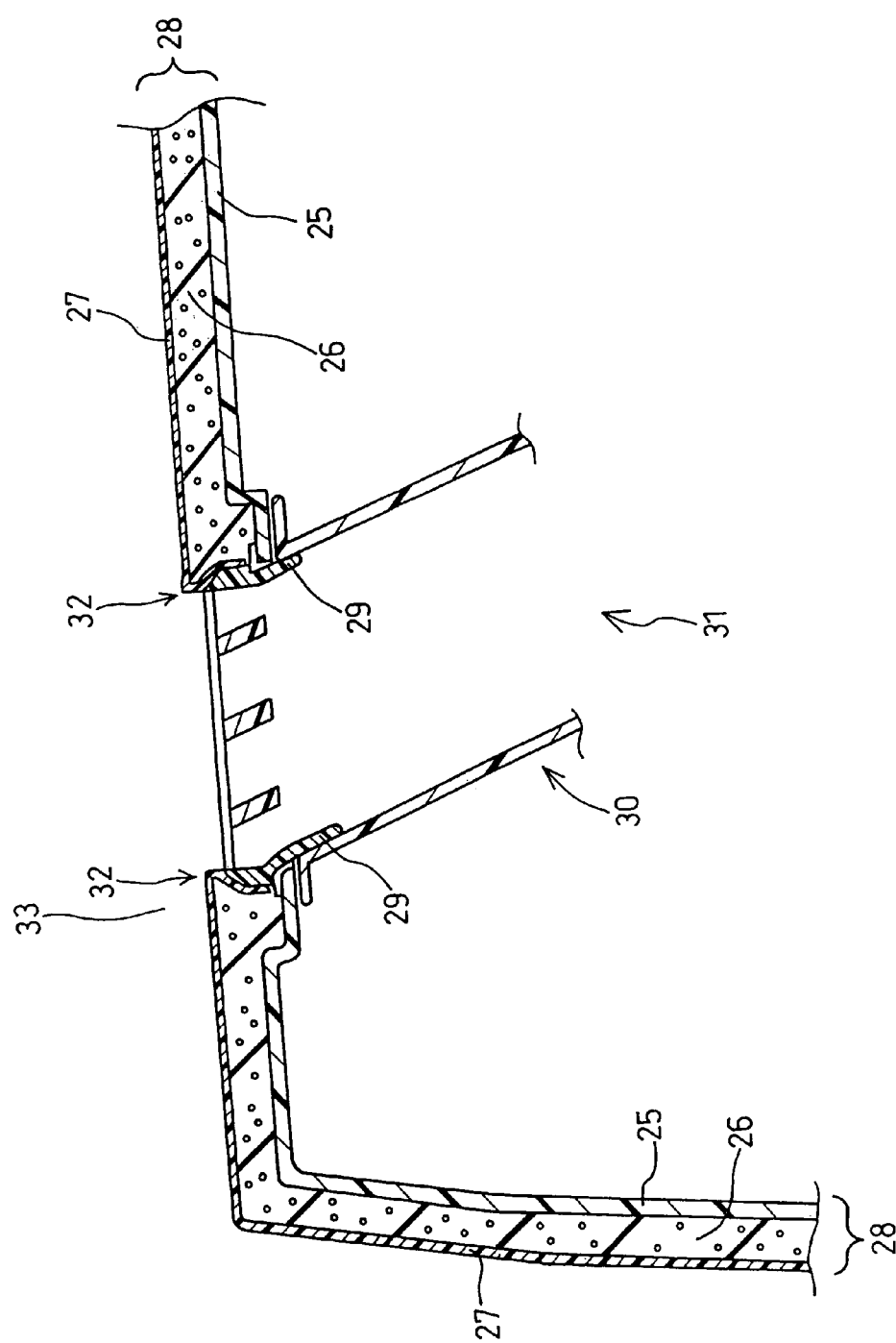
FIG. 3 is a schematic cross-sectional view for illustrating a molded product according to Example No. 3 of the present invention.

In a molded product according to Example No. 3 of the present invention, an automotive instrument panel makes a molded subassembly, and a defroster makes a functional component part. Note that Example No. 3 relates to the first aspect of the present invention. Except that the functional component part is different from that of Example No. 1, the present molded product according to Example No. 3 has the same arrangements as those of Example No. 1. FIG. 3 is a schematic cross-sectional view for illustrating the present molded product according to Example No. 3.

Similarly to Example No. 1, the present molded product according to Example No. 3 comprises a molded subassembly 28, and a functional component part 31. The molded subassembly 28 includes a substrate 25, a foamed layer 26, and a skin 27. The functional component part 31 includes an opening end 29, and a functional unit 30.

In the present molded product according to Example No. 3, note that a defroster nozzle makes the opening end 29. In the same manner as Example Nos. 1 and 2, not only the foamed layer 26 covers an end surface 32 of the opening end 29, but also the skin 27 covers the end surface 23. Hence, when an decorative surface 33 of the present molded product according to Example No. 3 is observed, the molded subassembly 28 and the opening end 29 are visible as integral.

Example No. 4

Figure 4:
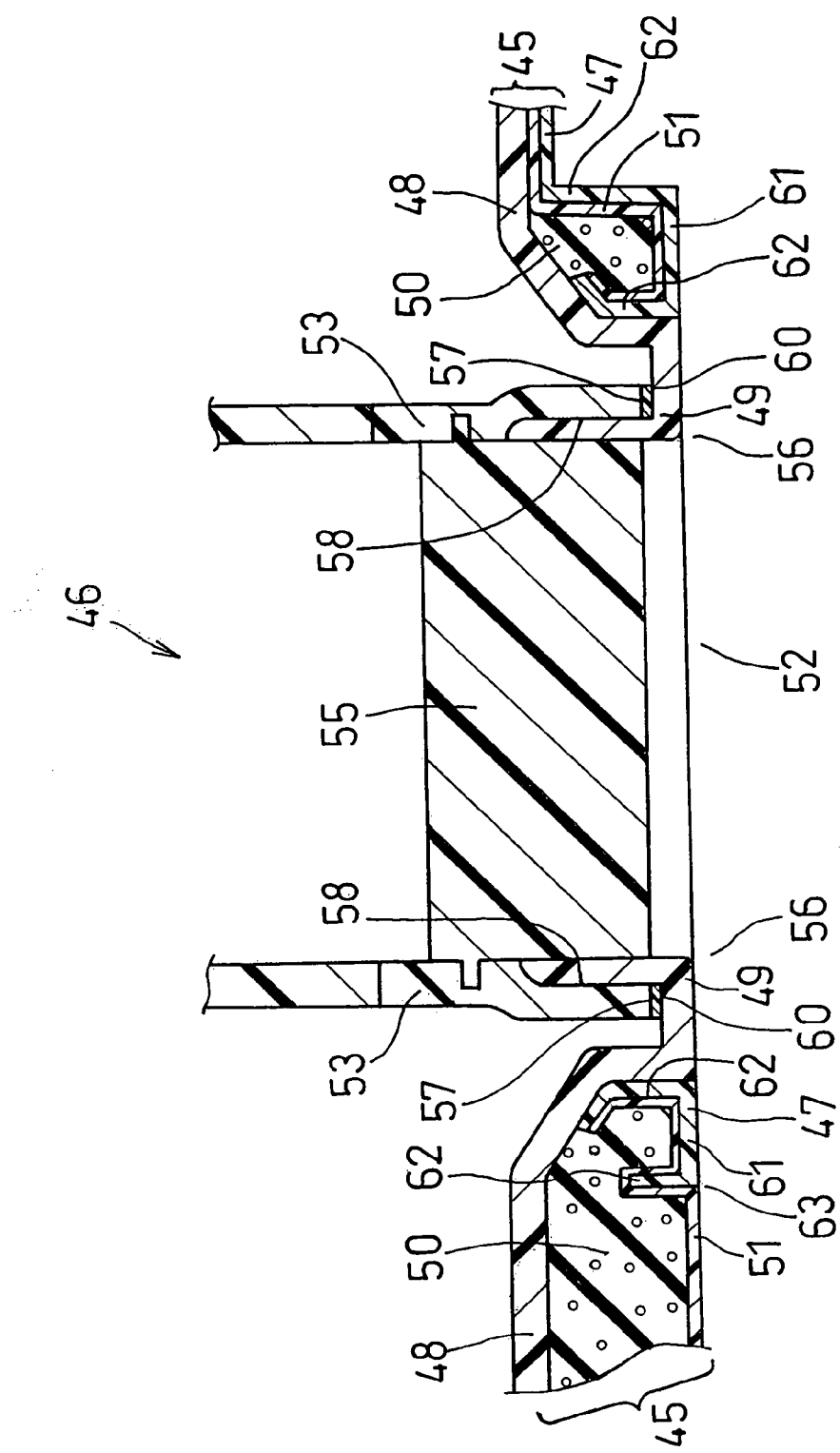
FIG. 4 is a schematic cross-sectional view for illustrating a molded product according to Example No. 4 of the present invention.

In a molded product according to Example No. 4 of the present invention, an automotive instrument panel makes a molded subassembly, and a register makes a functional component part. FIG. 4 is a schematic cross-sectional view for illustrating the present molded product according to Example No. 4. Note that Example No. 4 relates to the second aspect of the present invention.

The present molded product according to Example No. 4 comprises a molded subassembly 45, a functional component part 46, and a decorative component part 47. The molded subassembly 45 includes a substrate 48, a foamed layer 50 formed on the substrate 48, and a skin 51 covering the foamed layer 50. Moreover, the molded subassembly 45 is provided with a window 52, a through hole. In addition, a part of the substrate 48 makes an opening-end component part 49 which forms the window frame of the window 52.

The functional component part 46 includes an opening end 53, and a functional unit 55. The opening end 53 is fixed to the opening-end component part 49, and is integrated therewith. The functional unit 55 is disposed in the opening end 53. The opening end 53 is integrated with the opening-end component part 49 over the entire periphery. In particular, an end surface 57 of the opening end 53 is integrated with the opening-end component part 49 over the entire periphery; and a part of an inner peripheral surface 58 of the opening end 53 is integrated with the opening-end component part 49 over the entire periphery. Note that the end surface 57 is disposed to face the rear surface of a decorative surface 56 of the present molded product according to Example No. 4. Moreover, a bonding tab 60 is disposed between the end surface 57 of the opening end 53 and the opening-end component part 49. One of the opposite ends of the bonding tab 60 is bonded to the end surface 53, and the other one of the opposite ends thereof is bonded to the opening-end component part 49. Accordingly, the opening end 53 is held to the opening-end component part 49 by the bonding tab 60. Thus, the molded subassembly 45 and the opening end 53 are visible as integral, because the end surface 57 of the opening end 53 is covered with the opening-end component part 49, a part of the substrate 48, over the entire periphery.

The decorative component part 47 has a substantially letter "U"-shaped cross-section, and includes an exposed portion 61 and legs 62. The exposed portion 61 appears in the decorative surface 56. The legs 62 extend from the opposite ends of the exposed portion 61 toward the inside of the molded subassembly 45, specifically, toward the foamed layer 50. A parting line 63 between the decorative component part 47 and the skin 51 includes one of the legs 61 and the skin 51 formed on the one of the legs 61, and extends down from the decorative surface 56 to the inside of the molded subassembly 45. Therefore, the parting line 63 is visible as the decorative component part 47 and the skin 51 are joined closely in the decorative surface 56 or substantially seamless therein, because the skin 51 is integrated with the one of the legs 61 of the decorative component part 47 at the parting line 63.

Example No. 5

Figure 5:
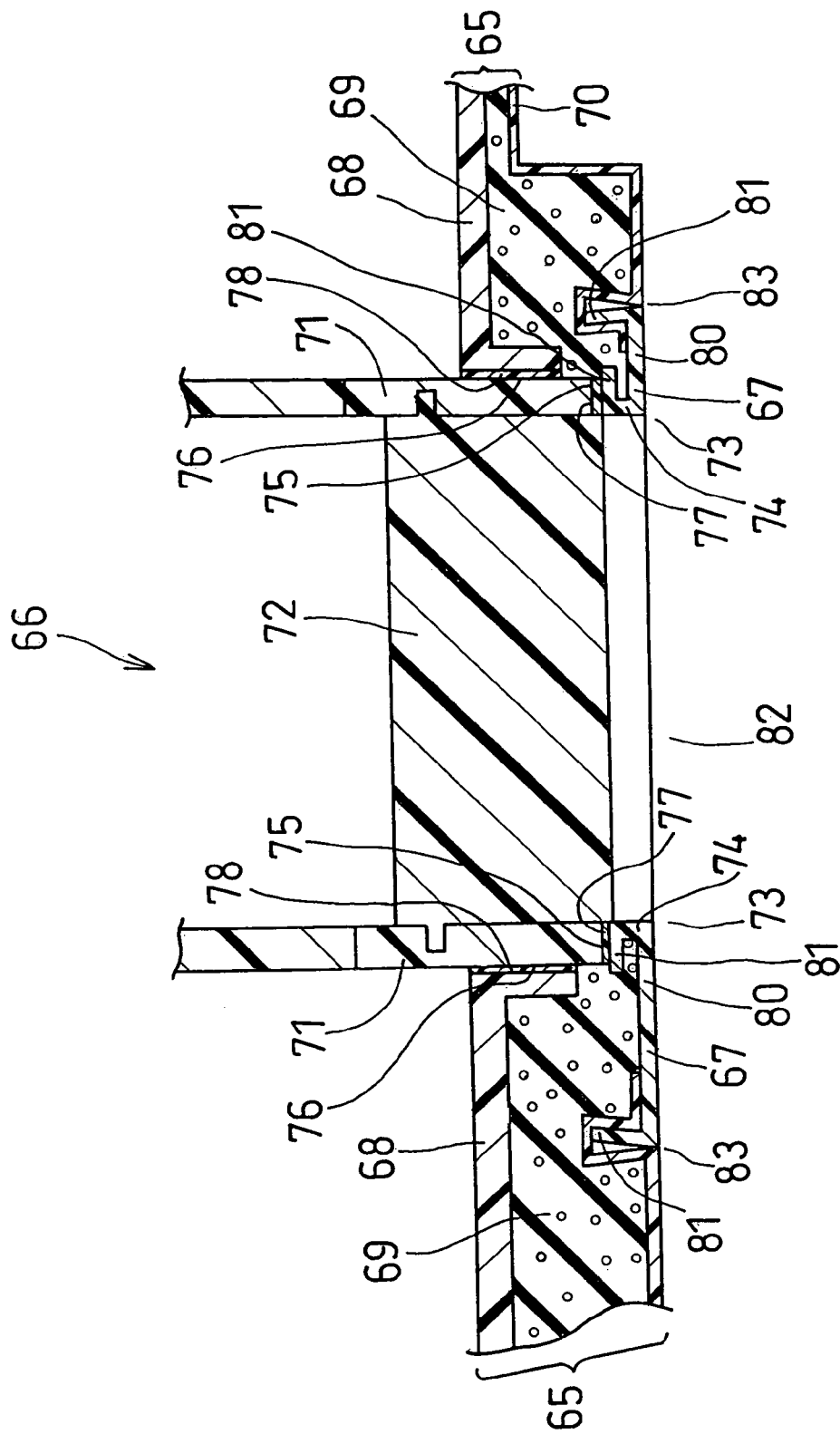
FIG. 5 is a schematic cross-sectional view for illustrating a molded product according to Example No. 5 of the present invention.

In a molded product according to Example No. 5 of the present invention, an automotive instrument panel makes a molded subassembly, and a register makes a functional component part. FIG. 5 is a schematic cross-sectional view for illustrating the present molded product according to Example No. 5. Note that Example No. 5 relates to the second aspect of the present invention.

Similarly to Example No. 4, the present molded product according to Example No. 5 comprises a molded subassembly 65, a functional component part 66, and a decorative component part 67. The molded subassembly 65 includes a substrate 68, a foamed layer 69, and a skin 70. The functional component part 66 includes an opening end 71, and a functional unit 72. Note that the opening end 71 is integrated with an opening-end component part 74, a part of the decorative component part 67, at an end surface 75 thereof which is disposed behind a decorative surface 73 of the present molded product according to Example No. 5. Additionally, a part of the opening end 71 is integrated with the substrate 58 over the entire periphery. Specifically, a part of a side surface 76 of the opening end 71 is integrated with the substrate 58 over the entire periphery. Moreover, a first bonding tab 77 is disposed between the end surface 75 of the opening end 71 and the opening-end component part 74. One of the opposite ends of the first bonding tab 77 is bonded to the end surface 75, and the other one of the opposite ends thereof is bonded to the opening-end component part 74. In addition, a second bonding tab 78 is disposed between the side surface 76 of the opening end 71 and the substrate 68. One of the opposite ends of the second bonding tab 78 is bonded to the side surface 76, and the other one of the opposite ends thereof is bonded to the substrate 68. Accordingly, the opening end 71 is held to the decorative component part 67 in a liquid proof manner by the first bonding tab 77, and is held to the substrate 68 in liquid proof manner by the second bonding tab 78. Thus, the opening-end component part 74, a part of the decorative component part 67, and the opening end 71 are visible as integral in the decorative surface 73, because the end surface 75 of the opening end 71 is covered with the opening-end component part 74 over the entire periphery. Moreover, note that the foamed layer 69 connects the opening end 71, the substrate 68, the skin 70 and the decorative component part 67 to integrate them.

The decorative component part 67 has a substantially letter "U"-shaped cross-section, and includes an exposed portion 80 and legs 81. In the present molded product according to Example No. 5, note that the decorative component member 67 makes not only the window frame of the window 82 in the molded subassembly 65 but also the entire periphery of the window 82 therein. Moreover, a parting line 83 between the decorative component part 67 and the skin 70 is formed as a narrow-width groove shape whose opening width is reduced as it approaches the decorative surface 73. Therefore, the parting line 83 is visible as the decorative component part 67 and the skin 70 are joined closely in the decorative surface 73 or substantially seamless therein.

Example No. 6

Figure 6:
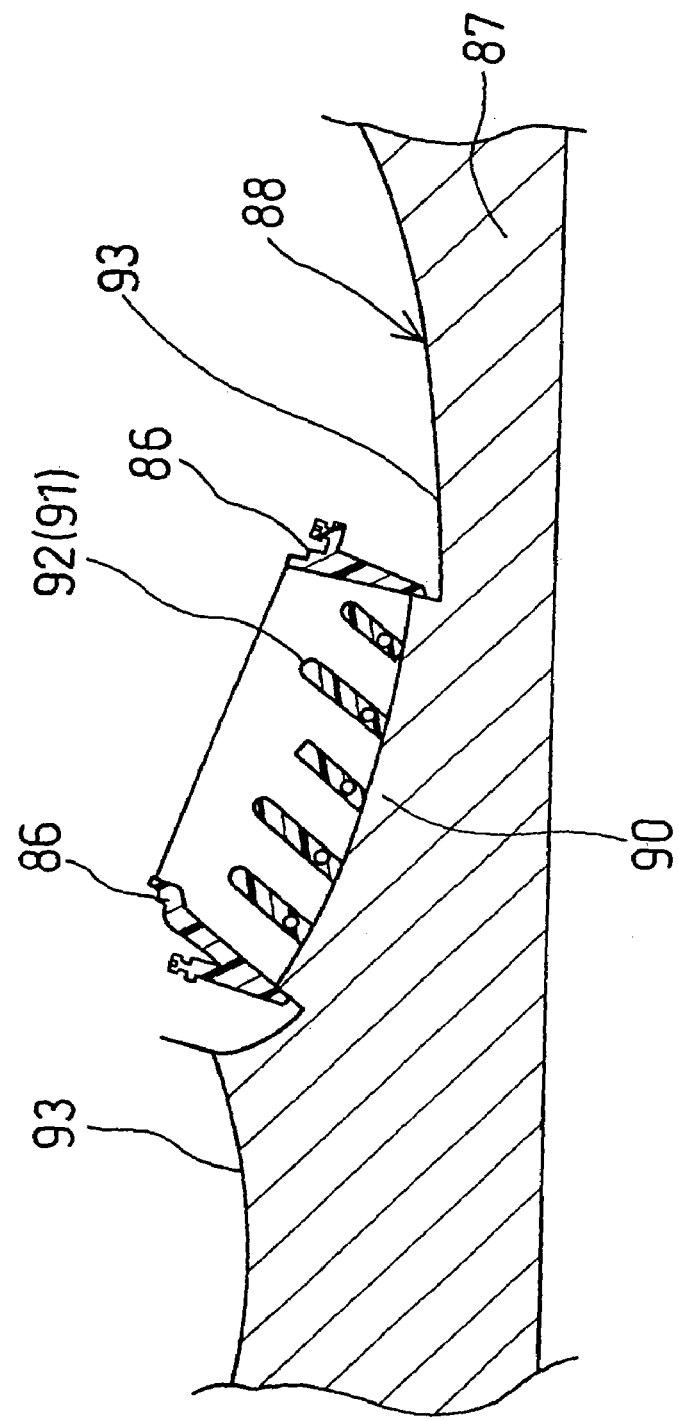
FIG. 6 is a schematic diagram for illustrating a skin layer forming step in a process according to Example No. 6 of the present invention for manufacturing a molded product.
Figure 7:
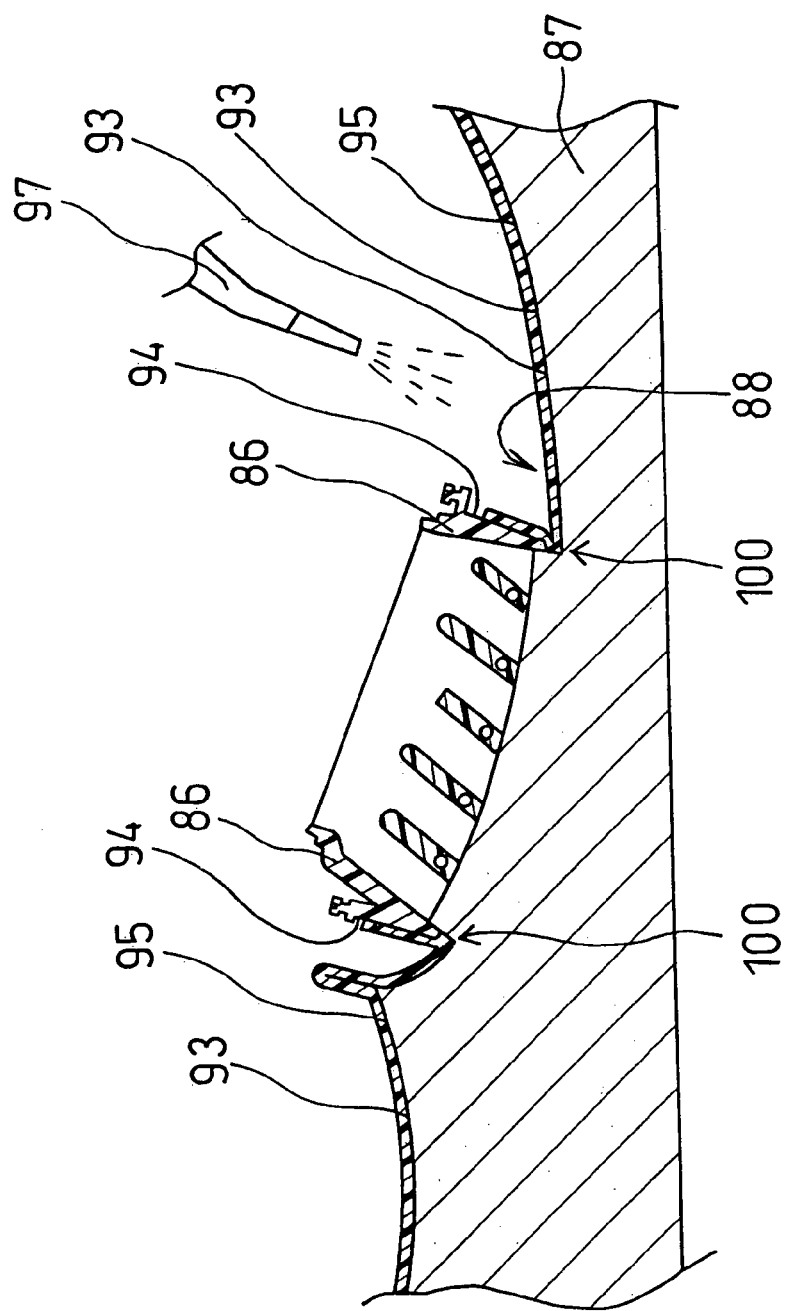
FIG. 7 is a schematic diagram for further illustrating the skin layer forming step.
Figure 8:
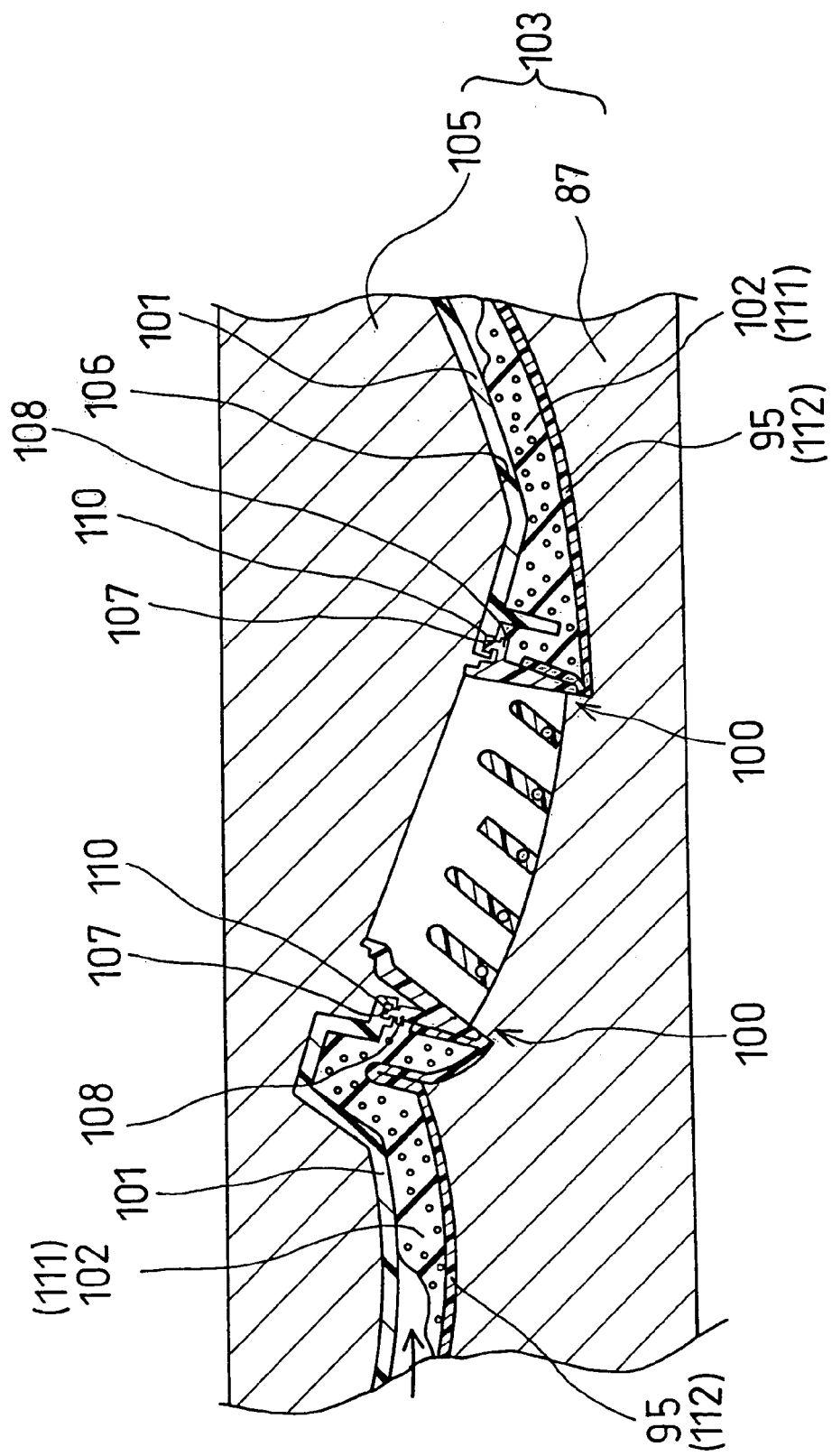
FIG. 8 is a schematic diagram for illustrating a foamed layer forming step in the process according to Example No. 6 for manufacturing the molded product.
Figure 9:
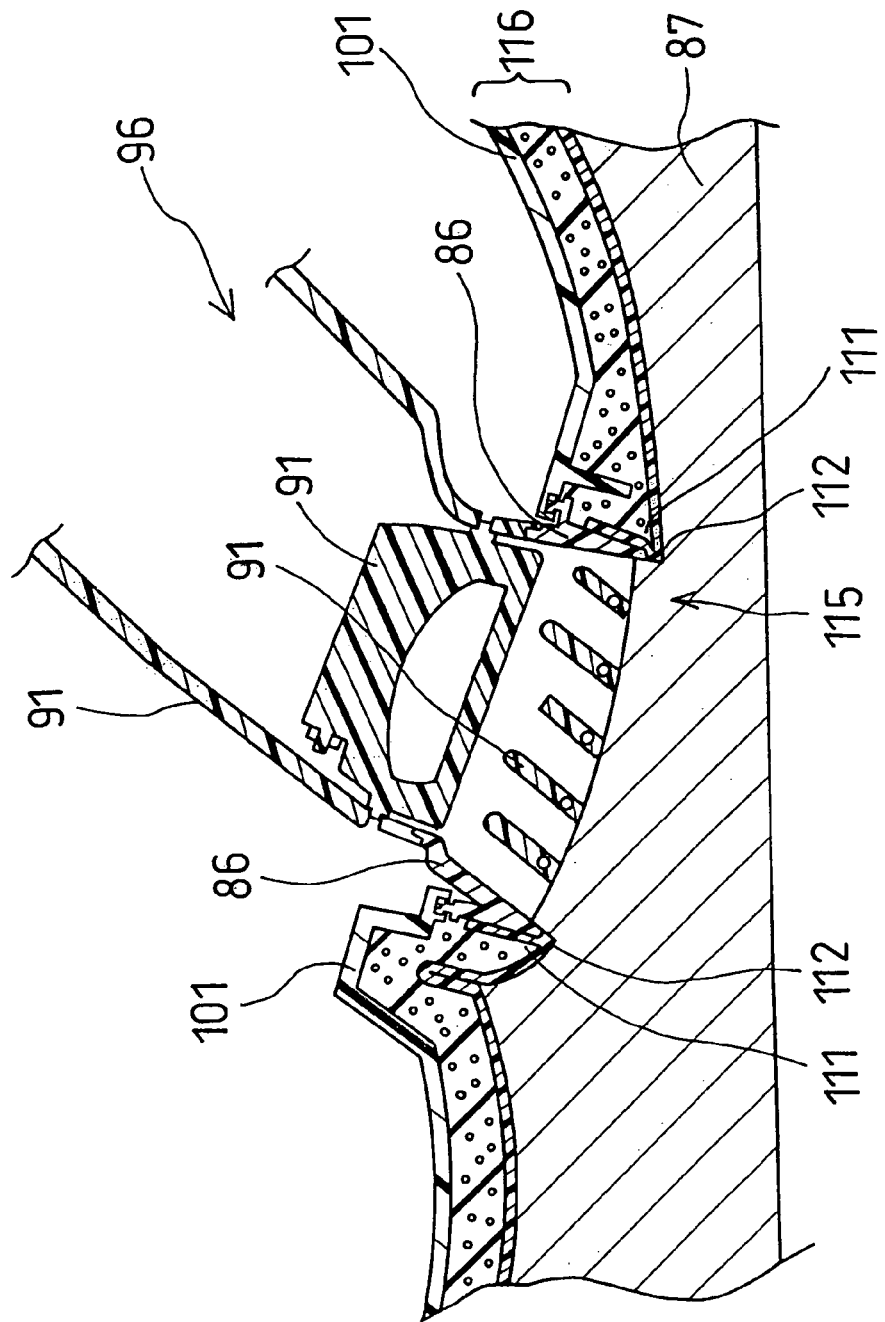
FIG. 9 is a schematic diagram for illustrating the molded product after completing the foamed layer forming step in the manufacturing process according to Example No. 6.

Example No. 6 of the present invention relates to a process for manufacturing the present molded product according to Example No. 1. FIGS. 6 and 7 illustrate a skin layer forming step of the present manufacturing process according to Example No. 6. FIG. 8 illustrates a foamed layer forming step of the present manufacturing process according to Example No. 6. FIG. 9 illustrates a completed molded product after the foamed layer forming step.

(1) Skin Layer Forming Step

The skin layer forming step of the present manufacturing process according to Example No. 6 was carried out in the following manner. First, an opening end 86 formed in advance was disposed so as to face a molding surface 88 of a mold 87. The mold 87 used herein comprised an end receiver 90 on which the opening end 86 was disposed. When the opening end 86 was disposed on the end receiver 90, a part of the end receiver 90 disposed inside the opening end 86 was formed so as to hold fins 92. Note that the fins 92 were a part of a functional unit 91, and were disposed in the opening end 86 integrally therewith. Thus, the opening end 86 was disposed on the mold 87 while it was held by the end receiver 90 from the inside.

After the opening end 86 was disposed on the molding surface 88 of the mold 87, a skin layer 95 was formed on a major molding surface 93 as illustrated in FIG. 7. The major molding surface 93 was parts of the molding surface 88 free from the end receiver 90 on which the opening end 86 was disposed. In this instance, note that the skin layer 95 was formed on a part of a side surface 94 of the opening end 86 simultaneously. The skin layer 95 was formed by spray forming. In the spray forming, the inner surface of the opening end 86 was covered with a not-shown mask. The skin layer 95 was formed of polyurethane elastomer. Specifically, the two raw materials of polyurethane elastomer, polyol and diisocyanate, were mixed in a spray gun, and the resulting polyurethane-elastomer raw-material mixture was sprayed onto the molding surface 88 through a spraying nozzle 97. Thus, the skin layer 95 was formed on the major molding surface 93 as well as on a part of the side surface 94 of the opening end 86. Note that the skin layer 95 was formed on an end surface 100 of the opening end 86 in a functional component part 96 as well in the skin layer forming step.

(2) Foamed Layer Forming Step

The foamed layer forming step was carried out by injecting a raw material for foamed resin 102 between a substrate 101 and the skin layer 95 formed in the skin layer forming step as illustrated in FIG. 8. Note that the used substrate 101 can be composed of polypropylene resin, ABS (acrylonitrile butadiene styrene) resin or ASG (acrylonitrile styrene glass) resin, for example, and that the used raw material for foamed rein 102 can be mixtures of polyol and diisocyanate for polyurethane resin.

The mold 87 used in the skin layer forming step was used as the lower mold half of a foaming mold 103. On the mold 87, the skin layer 95 had been formed in the skin layer forming step, and the opening end 86 had been disposed integrally with the skin layer 95. The substrate 101 formed in advance was disposed on a molding surface 106 in an upper mold half 105 of the foaming mold 103. Note that the opening end 86 was held to the substrate 101 by engaging engagement holes 107 disposed in the substrate 101 with engagement claws 110 disposed on a holder end 108 of the opening end 86. Moreover, the opening end 86 was fixed to the substrate 101 in a liquid proof manner by the engagement. Accordingly, the foaming raw material for the foamed resin 102 was inhibited from leaking between the opening end 86 and the substrate 101. In addition, the opening end 86 was fastened to the skin layer 95 integrally in the skin layer forming step. Consequently, the foaming raw material for the foamed resin 102 did not leak between the opening end 86 and the skin layer 95, either.

After disposing the opening end 86 and the substrate 101, the foaming mold 103 was closed. A raw material for the foamed resin 102, for example, a liquid mixture of polyol and diisocyanate, was injected through a not-shown sprue between the skin layer 95 and the substrate 101 in the direction designated with the arrow of FIG. 8. In the foaming mold 103, the injected raw material reacted to foam and pressurize the skin layer 95 and the substrate 101 toward the foaming mold 103, and cured eventually. Thus, a foamed layer 111 was formed in the space between the skin layer 95 and the substrate 101. Moreover, the foamed layer 111 was formed in a gap between the holder end 108 of the opening end 86 and the skin layer 95 formed via an end surface 100 of the opening end 86. Accordingly, the end surface 100 was covered with the skin layer 95 (or a skin 112 in a completed molded product) and the foamed layer 111, which was formed in the gap between the holder end 108 and the skin layer 95 formed via the end surface 100.

After completing the foamed layer forming step, the upper mold half 105 was detached from the foaming mold 103 in order to assemble a functional unit 91 with the opening end 86 as illustrated in FIG. 9. Thereafter, the skin 112, the substrate 101, the foamed layer 111, the opening end 86 and the functional unit 91 were removed from the mold 87. Thus, a molded product was manufactured. In the resulting molded product, the skin 112 covered the end surface 100 of the opening end 86 to appear as a part of a decorative surface 115. Accordingly, when the opening end 86 was observed in the decorative surface 115 of the resulting molded product, a molded subassembly 116 and the opening end 86 were visible as integral. Consequently, the molded subassembly 116 and the opening end 86 were continuous in view of the decoration. As a result, the molded product manufactured in accordance with Example No. 6 of the present invention was upgraded in terms of the decorativeness.

Example No. 7

Figure 10:
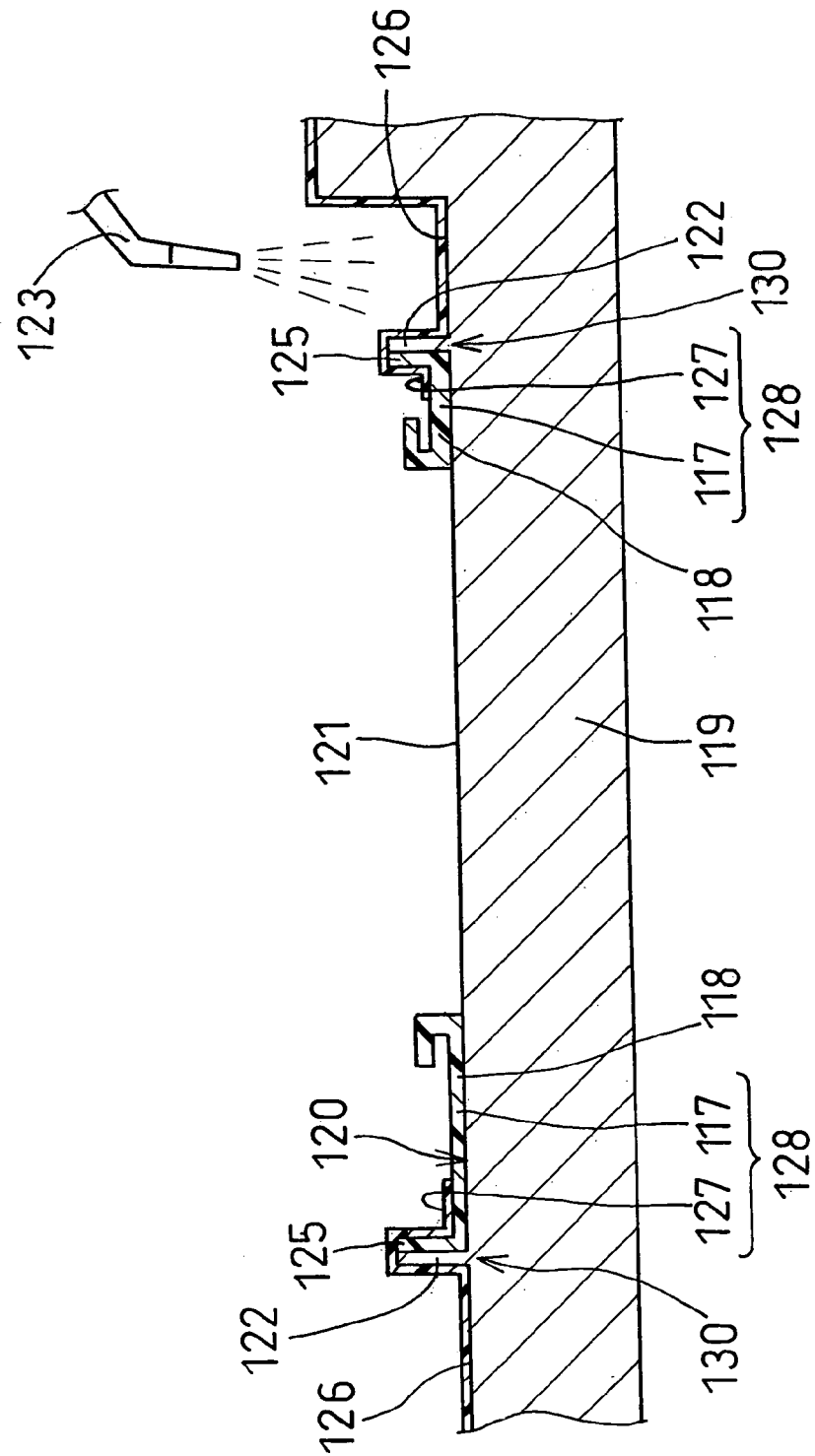
FIG. 10 is a schematic diagram for illustrating a skin assembly forming step in a process according to Example No. 7 of the present invention for manufacturing a molded product.
Figure 11:
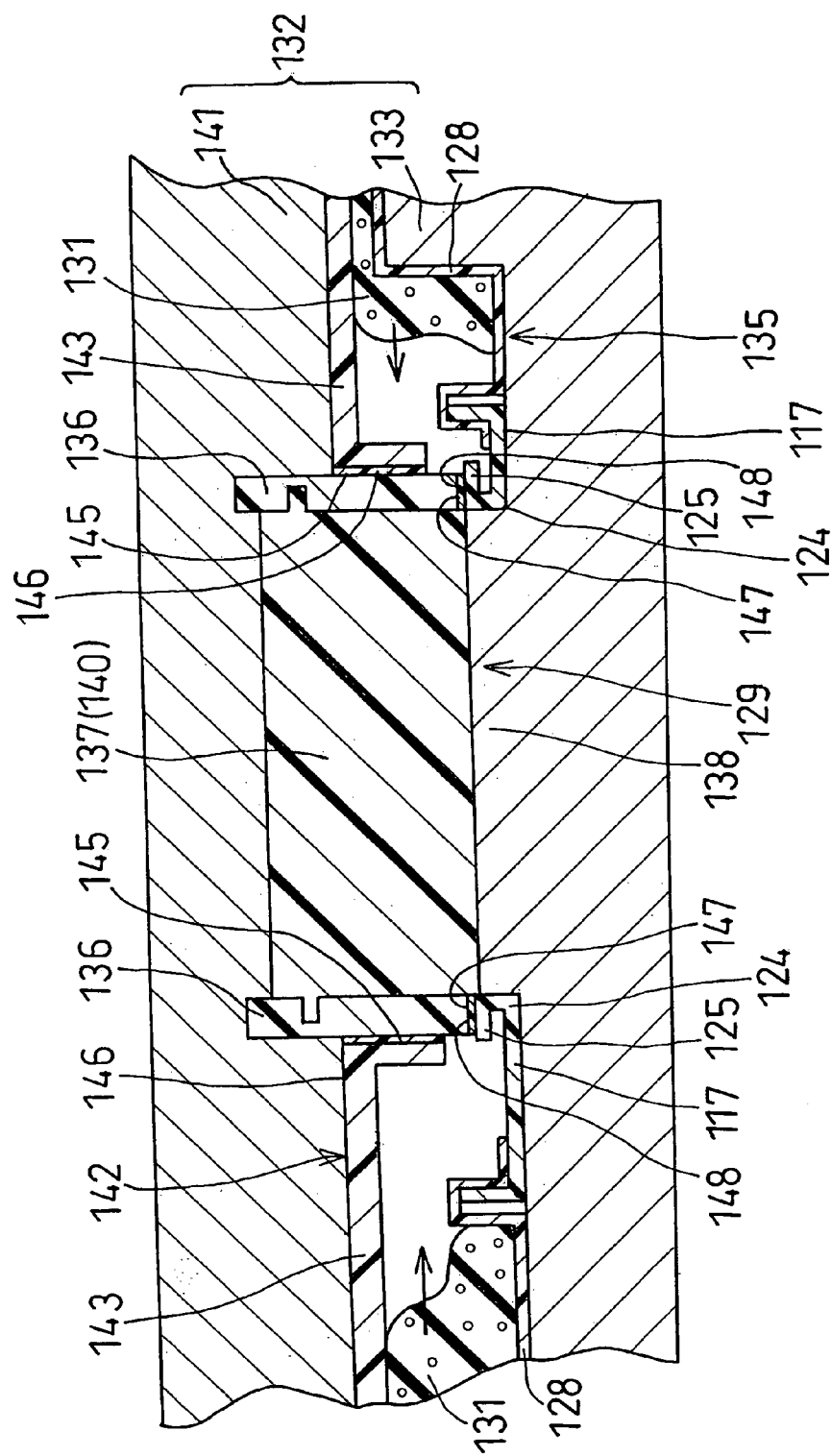
FIG. 11 is a schematic diagram for illustrating a foamed layer forming step in the process according to Example No. 7 for manufacturing the molded product.
Figure 12:
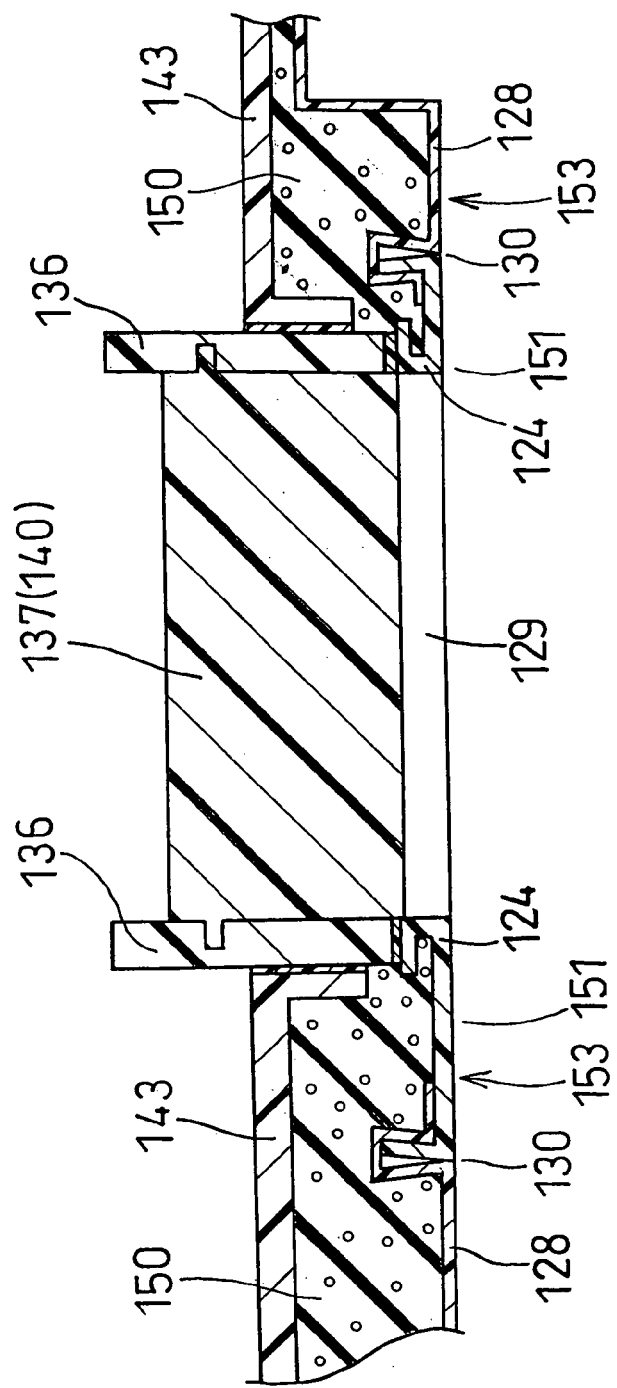
FIG. 12 is a schematic diagram for illustrating the molded product after completing the foamed layer forming step in the manufacturing process according to Example No. 7.
Figure 13:
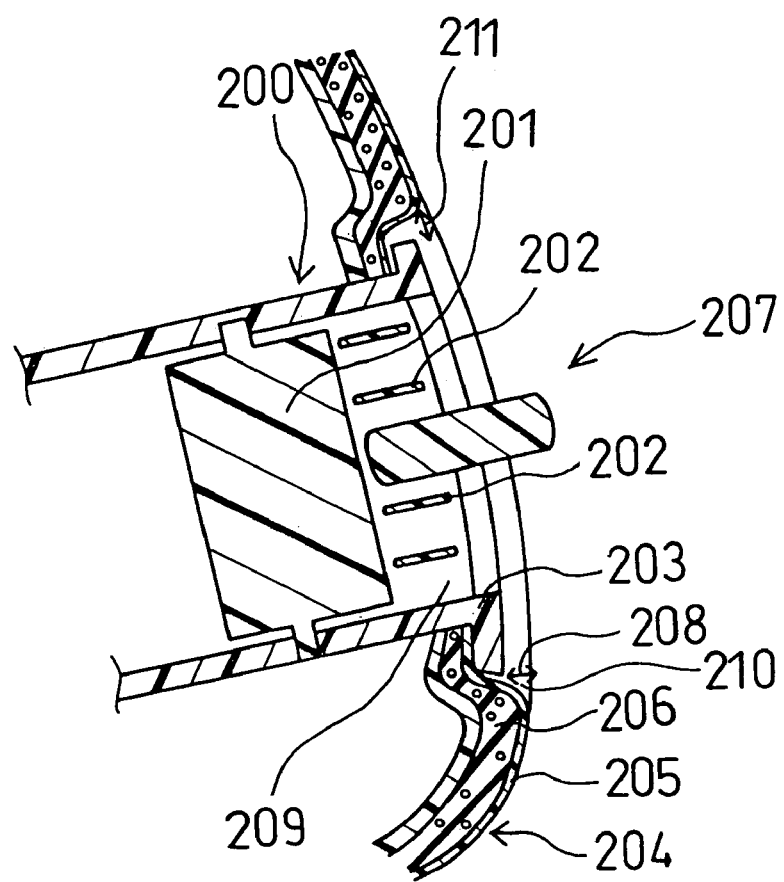
FIG. 13 is a cross-sectional view for illustrating how a molded subassembly is assembled with a functional component part by using a bezel in a conventional molded product.

Example No. 7 of the present invention relates to a process for manufacturing the present molded product according to Example No. 4. FIG. 10 illustrates a skin assembly forming step of the present manufacturing process according to Example No. 7. FIG. 11 illustrates a foamed layer forming step of the present manufacturing process according to Example No. 7. FIG. 12 illustrates a completed molded product after the foamed layer forming step.

(1) Skin Assembly Forming Step

The skin assembly forming step of the present manufacturing process according to Example No. 7 was carried out in the following manner. First, a decorative component part 117 was prepared in advance which was formed as a substantially letter-"U" shape in cross-section. The decorative component part 117 was disposed on a mold 119 so as to face an exposed portion 118 of the decorative component part 117 with a molding surface 120 of the mold 119. The mold 119 used herein was provided with a thin ring-shaped positioning plate 122 which projected from the molding surface 120. Note that the positioning plate 122 was disposed around the periphery of a window forming surface 121 of the mold 119 but away from the window forming surface 121. The positioning plate 122 had a thickness of 0.5 cm and a projecting height of 0.4 cm. The decorative component part 117 was disposed on the inner peripheral side of the positioning plate 122 so as to contact with the inner peripheral surface of the positioning plate 122. The decorative component part 117 was composed of ABS (acrylonitrile butadiene styrene) resin, and had a surface on which a woodgrain decoration was printed.

After the decorative component part 117 was disposed on the molding surface 120 of the mold 119, the same polyurethane-elastomer raw-material mixture as used in Example No. 6 was sprayed onto the molding surface 120 through a spraying nozzle 123. Thus, a skin layer 127 was formed on one of opposite legs 125 of the decorative component part 117, on a part of the rear side of the exposed portion 118, and on a major molding surface 126. Accordingly, a skin assembly 128 was formed which included the skin layer 127 and the decorative component part 117. In this instance, note that a parting line 130 between the decorative component part 117 and the skin layer 127 was formed as a narrow-width groove shape conforming to the shape of the positioning plate 122.

(2) Foamed Layer Forming Step

The foamed layer forming step was carried out by injecting a raw material for foamed resin 131 between a substrate 143 and the skin assembly 128, which had been formed in the skin assembly forming step, as illustrated in FIG. 11. Note that the used substrate 143 was composed of the same material as used in Example No. 6, that the used raw material for foamed rein 131 was identical with the raw material mixture used in Example No. 6.

The skin assembly 128 formed in the skin assembly forming step was removed from the mold 119, and was disposed on a lower mold half 133 of a foaming mold 132 so as to face a molding surface 135 of the lower mold half 133. In the present manufacturing process according to Example No. 7, a part of the decorative component part 117 made an opening-end component part 124, because a part of the decorative component part 117 formed the window frame of a window 129. Moreover, the decorative component part 117 made the skin assembly 128 together with the skin layer 127. Due to the arrangements, when the skin assembly 128 was disposed on the molding surface 133, the opening-end component part 124 was also disposed on the molding surface 133 simultaneously. The lower mold half 133 was provided with an end receiver 138 which held a fin assembly 137. The fin assembly 137 was to be integrally disposed in an opening end 136 of a completed molded product, and was a part of a functional unit 140. Thus, the opening end 136 was disposed on the lower mold half 133 while it was held by the end receiver 138 from the inside. The substrate 143 formed in advance was disposed on a molding surface 142 of an upper mold half 141 in the foaming mold 132. Note that the opening end 136 was held to the substrate 143 and the decorative component part 117 in a liquid proof manner because a side surface 145 of the opening end 136 was bonded to the substrate 143 by an adhesive tab 146 and an end surface 148 of the opening end 136 was bonded to one of opposite legs 125 of the decorative component part 117 by an adhesive tab 147.

After disposing the skin assembly 128 and the substrate 143, the foaming mold 132 was closed. A raw material for foamed resin 131 was injected through a not-shown sprue into a space demarcated by the skin assembly 128, the substrate 143 and the opening end 136 in the direction designated with the arrows of FIG. 11. The raw material was the same as the raw material used in Example No. 6. In the foaming mold 132, the injected raw material reacted to foam and pressurize the opening-end component part 124 and the opening end 136 toward the foaming mold 132, and cured eventually. Thus, as illustrated in FIG. 12, a foamed layer 150 was formed in the space demarcated by the substrate 143, the skin assembly 128 and the opening-end component part 124. Moreover, the foaming raw material for the foamed layer 150 exerted a foaming pressure which pressurized the groove-shaped parting line 130. Accordingly, the groove-shaped parting line 130 was joined closely. Consequently, the opening width of the groove-shaped parting line 130 was reduced in a decorative surface 151 of a completed molded product. As a result, the parting line 130 was visible as being joined closely or substantially seamless in the decorative surface 151.

After completing the foamed layer forming step, the upper mold half 141 was detached from the foaming mold 132. Thereafter, the skin assembly 128, the substrate 143, the foamed layer 150, the opening end 136 and the functional unit 140 were removed from the lower mold half 133. Thus, a molded product was manufactured. In the resulting molded product, the opening-end component part 124 covered the end surface 148 of the opening end 136 to appear as a part of the decorative surface 151. Accordingly, when the opening end 136 was observed in the decorative surface 151, the opening end 136 and the decorative component part 117 making the opening-end component part 124 were visible as integral. Consequently, a molded subassembly 153 and the opening end 136 were continuous in view of the decoration. Moreover, the decorative component part 117 and the skin layer 127 were more continuous in view of the decoration, because the parting line 130 between the decorative component part 117 and the skin layer 127 were visible as being joined closely or substantially seamless in the decorative surface 151. In addition, the decorative component part 117 had a decoration which was different from that of the skin layer 117. As a result, the molded product manufactured by Example No. 7 of the present invention was further upgraded in terms of the decorativeness.

Having now fully described the present invention, it will be apparent to one of ordinary skill in the art that many changes and modifications can be made thereto without departing from the spirit or scope of the present invention as set forth herein including the appended claims.

What is claimed is:

1. A process for manufacturing a molded product, comprising:
    a molded subassembly including:
        a substrate;
        a foamed layer formed on the substrate; and
        a skin covering the foamed layer; and
        a window formed as a part of the molded subassembly, and demarcated by a window frame; and
    a functional component part including:
        an opening end forming the window frame of the window, and fastened integrally to the skin at a part thereof at least; and
        a functional unit disposed in the opening end;
    the process comprising the steps of:
        forming skin layer by preparing the functional component part and a mold, the functional component part including the opening end and the functional unit disposed in the opening end, the mold including opposite molding surfaces, one of the opposite molding surfaces having a window-forming surface, disposing the functional component part so that at least the opening end faces one of the opposite molding surfaces, and forming the skin layer on one of the opposite molding surfaces, excepting the window-forming surface, as well as on at least a part of the opening end, wherein the skin layer and at least a part of the opening end are fastened integrally so that no gaps occur between the skin layer and an end surface of the opening end;
        forming a foamed layer by disposing the substrate formed in advance on the other one of the opposite molding surfaces of the mold, injecting a raw material between the skin layer and the substrate, and foaming the raw material,
    wherein a part of the mold used in both the forming of the skin layer and the forming of the foamed layer; and during the forming of the skin layer, the skin layer is formed on the part of the mold; and during the forming of the foamed layer, the foamed layer is formed on the skin layer held by the part of the mold.

2. The process set forth in claim 1, wherein the skin layer is formed on one of the opposite molding surfaces, excepting the window-forming surface, as well as on at least an end surface of the opening end in the skin layer forming step.

3. The process set forth in claim 1, wherein the opening end of the functional unit is fixed to the substrate in a liquid proof manner in the foamed layer forming step.

4. The process set forth in claim 1, wherein the skin layer forming step is carried out by spray forming.

5. A process for manufacturing a molded product, comprising:
    a molded subassembly including:
        a substrate;
        a foamed layer formed on the substrate; and
        a skin covering the foamed layer; and
        a window formed as a part of the molded subassembly, and demarcated by
    a window frame; and
        an opening-end component part forming the window frame of the window;
        a functional unit disposed in the opening-end component part; and
        a decorative component part disposed on an outer periphery of the window, wherein:
            a parting line between the decorative component part and the skin is visible as being joined closely in a decorative surface of the molded product;
    the process comprising the steps of:
        forming a skin assembly including the decorative component part and the skin layer by preparing the decorative component part and a mold, the decorative component part including an exposed portion and legs extending from the opposite ends of the exposed portion and having a substantially letter "U"-shaped cross-section, the mold including opposite molding surfaces, one of the opposite molding surfaces having a window-forming surface, disposing the decorative component part so as to face one of the opposite molding surfaces, forming the skin layer on one of the opposite molding surfaces, excepting the window-forming surface, as well as on at least a part of the legs, the skin layer being formed on the one of the opposite molding surfaces in a manner that inhibits leaking of a foamed layer between the skin layer and the one of the opposite molding surfaces that is subsequently formed thereon;

wherein the parting line between the decorative component part and the skin layer is formed as a narrow-width groove shape conforming to a cross-sectional shape of a positioning plate; and forming the foamed layer by disposing a substrate formed in advance, the skin assembly and an opening-end component part on the other one of the opposite molding surfaces of the mold, injecting a raw material between the substrate, the skin assembly and the opening-end component part, and foaming the raw material, wherein the decorative component part and the skin layer are pressed to close to each other at a parting line therebetween by a foaming pressure exerted by the foaming raw material, and an opening width of the parting line is reduced.

6. The process set forth in claim 5, wherein positioning plate having narrow-width protruding shape in cross-section is further disposed on one of the opposite molding surfaces of the mold; and the opening width of the parting line is reduced by the foaming pressure in the foamed layer foaming step.

7. The process set forth in claim 5, wherein the opening-end component part is fixed to the substrate in a liquid proof manner in the foamed layer forming step.

8. The process set forth in claim 5, wherein the skin assembly forming step is carried out by spray forming.

* * * * *